United States Patent
Nishijima et al.

(10) Patent No.: US 10,081,741 B2
(45) Date of Patent: Sep. 25, 2018

(54) ADHESIVE AGENT COMPOSITION, ADHESIVE SHEET, AND ELECTRONIC DEVICE

(71) Applicant: LINTEC CORPORATION, Tokyo (JP)

(72) Inventors: Kenta Nishijima, Tokyo (JP); Satoshi Naganawa, Tokyo (JP); Emi Fuchi, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 131 days.

(21) Appl. No.: 14/648,580

(22) PCT Filed: Nov. 29, 2013

(86) PCT No.: PCT/JP2013/082172
§ 371 (c)(1),
(2) Date: May 29, 2015

(87) PCT Pub. No.: WO2014/084351
PCT Pub. Date: Jun. 5, 2014

(65) Prior Publication Data
US 2015/0307750 A1    Oct. 29, 2015

(30) Foreign Application Priority Data

Nov. 30, 2012  (JP) .................. 2012-263793

(51) Int. Cl.
*C09J 7/00* (2018.01)
*C09J 7/02* (2006.01)
(Continued)

(52) U.S. Cl.
CPC ............. *C09J 7/0214* (2013.01); *C09J 7/383* (2018.01); *C09J 109/00* (2013.01);
(Continued)

(58) Field of Classification Search
CPC ... C09J 7/0214; C09J 109/00; C09J 2201/622
See application file for complete search history.

(56) References Cited

U.S. PATENT DOCUMENTS

| 2003/0080678 A1* | 5/2003 | Kim ............... H01L 51/524 313/504 |
| 2005/0095383 A1* | 5/2005 | Campbell ............... B32B 27/12 428/40.1 |

(Continued)

FOREIGN PATENT DOCUMENTS

| JP | 02284978 A | * 11/1990 | ............... C09J 4/00 |
| JP | 05-101884 A | 4/1993 | |

(Continued)

OTHER PUBLICATIONS

Abstract of JP 02284978. See above for inventor and date.*
(Continued)

*Primary Examiner* — Victor S Chang
(74) *Attorney, Agent, or Firm* — Birch, Stewart, Kolasch & Birch, LLP

(57) ABSTRACT

The present invention provides: an adhesive composition comprising a diene-based rubber (A) that includes a radiation-curable functional group, a cured adhesive layer having a thickness of 60 μm that is formed by curing the adhesive composition having a water vapor transmission rate at a temperature of 40° C. and a relative humidity of 90% of 30 g/(m²·day) or less; an adhesive sheet comprising a curable adhesive layer that is formed using the adhesive composition; and an electronic device comprising a sealing material, the sealing material being formed using the adhesive composition. According to the present invention, provided are: an adhesive composition that is useful as a material for forming an adhesive layer that exhibits an excellent water barrier capability and sufficient cohesive strength, and exhibits adhesion and holding power in a well-balanced (Continued)

manner, an adhesive sheet that includes an adhesive layer that is formed using the adhesive composition, and an electronic device that includes a sealing material that is formed using the adhesive composition.

11 Claims, 2 Drawing Sheets

(51) Int. Cl.
*C09J 109/00* (2006.01)
*H05B 33/04* (2006.01)
*H01L 23/29* (2006.01)
*C09J 7/38* (2018.01)
*H01L 51/52* (2006.01)

(52) U.S. Cl.
CPC ........... *H01L 23/296* (2013.01); *H05B 33/04* (2013.01); *C09J 2201/622* (2013.01); *C09J 2409/00* (2013.01); *C09J 2413/00* (2013.01); *C09J 2413/003* (2013.01); *H01L 51/5246* (2013.01); *H01L 2924/0002* (2013.01)

(56) References Cited

U.S. PATENT DOCUMENTS

2008/0220245 A1* 9/2008 Suzuki .................. H01L 51/524
428/332

| | | | |
|---|---|---|---|
| 2009/0026934 A1 | 1/2009 | Fujita et al. | |
| 2009/0087591 A1 | 4/2009 | Larson et al. | |
| 2012/0283375 A1 | 11/2012 | Kageyama | |

FOREIGN PATENT DOCUMENTS

| | | | |
|---|---|---|---|
| JP | 05-182759 A | | 7/1993 |
| JP | 06-065334 A | | 3/1994 |
| JP | 2003-192750 A | | 7/2003 |
| JP | 2004-087153 A | | 3/2004 |
| JP | 2004-224991 A | | 8/2004 |
| JP | 2005240005 A | * | 9/2005 |
| JP | 2006-008819 A | | 1/2006 |
| JP | 2010-072471 A | | 4/2010 |
| WO | WO 2011/040490 A1 | | 4/2011 |
| WO | WO 2011/046120 A1 | | 4/2011 |
| WO | WO 2011/062167 A1 | | 5/2011 |
| WO | WO 2012/005169 A1 | | 1/2012 |
| WO | WO 2012/014682 A1 | | 2/2012 |
| WO | WO 2012/029960 A1 | | 3/2012 |

OTHER PUBLICATIONS

Derwent Abstract of JP 2005-240005. See above for date and inventor.*
Machine translation of JP-2013-234208-A dated Nov. 21, 2013.
International Search Report issued in PCT/JP2013/082172 dated Mar. 4, 2014.

* cited by examiner

ADHESIVE AGENT COMPOSITION, ADHESIVE SHEET, AND ELECTRONIC DEVICE

TECHNICAL FIELD

The present invention relates to an adhesive composition that is useful as a material for forming an adhesive layer that exhibits an excellent water barrier capability (water-blocking capability) and sufficient cohesive strength, and exhibits adhesion and holding power in a well-balanced manner, an adhesive sheet that includes an adhesive layer that is formed using the adhesive composition, and an electronic device that includes a sealing material that is formed using the adhesive composition.

BACKGROUND ART

In recent years, an organic EL device has attracted attention as a light-emitting device that can emit light with high luminance through low-voltage DC drive.

However, the organic EL device has a problem in that emission properties (e.g., luminance, luminous efficiency, and luminous uniformity) easily deteriorate with the passage of time.

It is considered that a deterioration in emission properties occurs when oxygen, water, and the like enter the organic EL device, and cause the electrode and the organic layer to deteriorate. Methods that utilize a sealing material have been proposed in order to solve this problem. For example, Patent Document 1 discloses an organic EL device having a configuration in which a transparent electrode, a hole-transporting layer, an organic EL layer, and a bottom electrode are sequentially stacked on a glass substrate, and a non-water-permeable glass substrate is secured thereon through a photocurable resin layer that exhibits humidity resistance. Patent Document 2 discloses a method that seals an organic EL device using a sealing film that is formed using a moisture-proof polymer film and an adhesive layer.

An acrylic-based adhesive and an acrylic-based pressure-sensitive adhesive (hereinafter referred to as "acrylic-based adhesive and the like") have been known as an adhesive and a pressure-sensitive adhesive that are used as the sealing material for the organic EL device, taking account of optical properties such as transparency. For example, Patent Document 3 discloses a UV-curable acrylic-based adhesive that can be cured at room temperature as a sealing material for an organic EL display. Patent Document 4 discloses an acrylic-based pressure-sensitive adhesive as a pressure-sensitive adhesive that can form a pressure-sensitive adhesive layer that maintains transparency even when subjected to a heat treatment and a drying treatment that are performed when producing the organic EL device in order to remove water and the like.

However, a sealing material that is formed using the acrylic-based adhesive and the like has an insufficient water barrier capability, and is not suitable as a sealing material for which a very high water barrier capability is required (e.g., the sealing material for the organic EL device). When a sealing material that is formed using the acrylic-based adhesive and the like has a crosslinked structure, the sealing material may be easily delaminated from the adherend due to an impact, vibrations, heat, or the like, and the water barrier capability may deteriorate to a large extent.

In recent years, an adhesive that includes a polyisobutylene-based resin has been proposed as a sealing adhesive that exhibits a good water barrier capability. For example, Patent Document 5 discloses an adhesive composition that is used as a sealing material for an organic EL display, and includes a specific hydrogenated cycloolefin-based polymer and a polyisobutylene resin.

RELATED-ART DOCUMENT

Patent Document

Patent Document 1: JP-A-5-182759
Patent Document 2: JP-A-5-101884
Patent Document 3: JP-A-2004-87153
Patent Document 4: JP-A-2004-224991
Patent Document 5: JP-T-2009-524705 (WO2007/0087281)

SUMMARY OF THE INVENTION

Technical Problem

A sealing material obtained using the adhesive composition disclosed in Patent Document 5 exhibits a good water barrier capability as compared with a sealing material obtained using an acrylic-based adhesive. However, the water barrier capability of the sealing material obtained using the adhesive composition disclosed in Patent Document 5 is insufficient when it is used as a sealing material for the organic EL device or the like. Moreover, since the balance between adhesion and holding power is poor, the sealing material may come off from the adherend, or may be delaminated from the adherend, due to heat or vibrations that occur when the device is driven, whereby the water barrier capability may deteriorate to a large extent.

The invention was conceived in view of the above situation. An object of the invention is to provide an adhesive composition that is useful as a material for forming an adhesive layer that exhibits an excellent water barrier capability and sufficient cohesive strength, and exhibits adhesion and holding power in a well-balanced manner, an adhesive sheet that includes an adhesive layer that is formed using the adhesive composition, and an electronic device that includes a sealing material that is formed using the adhesive composition.

Solution to Problem

The inventors of the invention conducted extensive studies in order to solve the above problem. As a result, the inventors found that an adhesive layer that exhibits sufficient cohesive strength and an excellent water barrier capability, and exhibits adhesion and holding power in a well-balanced manner, can be obtained by utilizing an adhesive composition that includes a diene-based rubber that includes a (meth)acryloyl group. This finding has led to the completion of the invention.

Several aspects of the invention provide the following adhesive composition (see (1) to (6)), adhesive sheet (see (7) to (12)), and electronic device (see (13)).

(1) An adhesive composition including a diene-based rubber (A) that includes a radiation-curable functional group, a cured adhesive layer having a thickness of 60 μm that is formed by curing the adhesive composition having a water vapor transmission rate at a temperature of 40° C. and a relative humidity of 90% of 30 g/(m$^2$·day) or less.

(2) The adhesive composition according to (1), wherein the diene-based rubber (A) is a polyisoprene rubber that includes a (meth)acryloyl group.

(3) The adhesive composition according to (1), wherein the diene-based rubber (A) includes a polymer that includes a repeating unit represented by the following formula (1) and a repeating unit represented by the following formula (II) in its molecule,

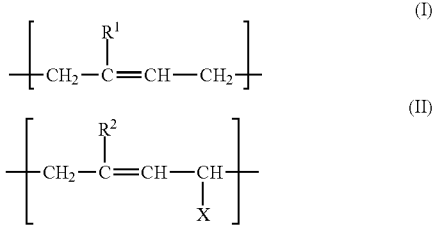

wherein $R^1$ and $R^2$ are independently a hydrogen atom or an alkyl group having 1 to 5 carbon atoms, X is a group represented by the following formula (III),

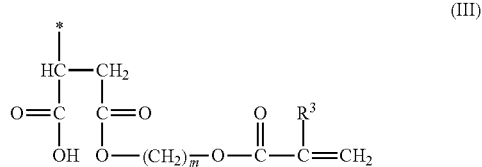

$R^3$ is a hydrogen atom or an alkyl group having 1 to 5 carbon atoms, and "*" is the bonding position.
(4) The adhesive composition according to (1), wherein the diene-based rubber (A) has a number average molecular weight (Mn) of 1000 to 100,000.
(5) The adhesive composition according to (1), further including a rubber-based polymer (B) that does not include a radiation-curable functional group.
(6) The adhesive composition according to (1), further including a photoinitiator (C).
(7) The adhesive composition according to (1), further including a tackifier (D).
(8) An adhesive sheet including a curable adhesive layer that is formed using the adhesive composition according to any one of (1) to (7), and a release sheet that is provided on one side or each side of the curable adhesive layer.
(9) An adhesive sheet including a curable adhesive layer that is formed using the adhesive composition according to any one of (1) to (7), and a base sheet.
(10) An adhesive sheet including a cured adhesive layer that is formed by curing the adhesive composition according to any one of (1) to (7), and a release sheet that is provided on one side or each side of the cured adhesive layer.
(11) An adhesive sheet including a cured adhesive layer that is formed by curing the adhesive composition according to any one of (1) to (7), and a base sheet.
(12) The adhesive sheet according to any one of (8) to (11), the adhesive sheet being used to form a sealing material for an electronic device.
(13) An electronic device including a sealing material, the sealing material being formed using the adhesive composition according to any one of (1) to (7).

Advantageous Effects of the Invention

The aspects of the invention thus provide an adhesive composition that is useful as a material for forming an adhesive layer that exhibits an excellent water barrier capability and sufficient cohesive strength, and exhibits adhesion and holding power in a well-balanced manner, an adhesive sheet that includes an adhesive layer that is formed using the adhesive composition, and an electronic device that includes a sealing material that is formed using the adhesive composition.

DESCRIPTION OF EMBODIMENTS

Figure 1:
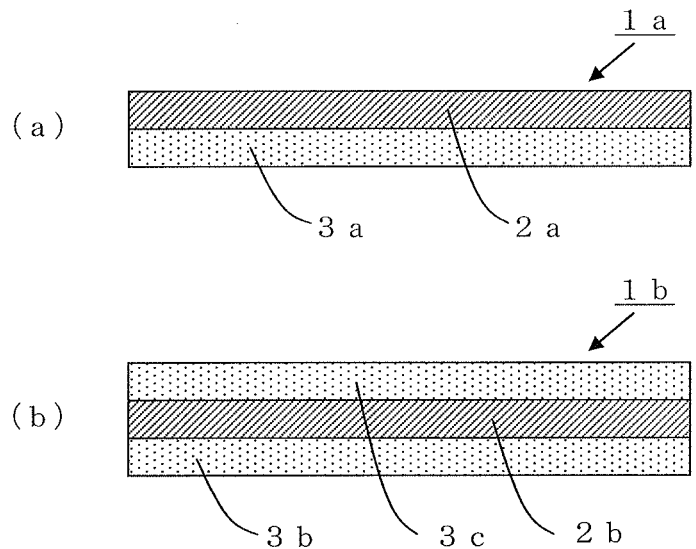
FIG. 1 is a view illustrating an example of the layer configuration of an adhesive sheet according to one embodiment of the invention.

An adhesive composition, an adhesive sheet, and an electronic device according to several exemplary embodiments of the invention are described in detail below.
1) Adhesive Composition
An adhesive composition according to one embodiment of the invention includes a diene-based rubber (A) that includes a radiation-curable functional group, a cured adhesive layer having a thickness of 60 μm that is formed by curing the adhesive composition having a water vapor transmission rate at a temperature of 40° C. and a relative humidity of 90% of 30 g/(m²·day) or less.
Diene-Based Rubber (A) that Includes Radiation-Curable Functional Group
The diene-based rubber (A) that includes a radiation-curable functional group (hereinafter may be referred to as "diene-based rubber (A)") used in connection with one embodiment of the invention is a diene-based rubber that is formed of a polymer that includes a radiation-curable functional group at the terminal of the main chain and/or in the side chain;
The term "diene-based rubber" used herein refers to a rubber-like polymer that includes a double bond in the polymer main chain.
The term "radiation-curable functional group" used herein refers to a functional group that exhibits ionizing radiation-curability. Examples of such a functional group include an alkenyl group such as a vinyl group and an allyl group, a (meth)acryloyl group, an oxetanyl group, an epoxy group, and the like.
The term "(meth)acryloyl group" used herein refers to an acryloyl group or a methacryloyl group.
The average number of radiation-curable functional groups per molecule of the diene-based rubber (A) is normally 1.5 or more, preferably 1.5 to 20, more preferably 2 to 15, and still more preferably 2 to 10. When the diene-based rubber (A) includes a radiation-curable functional group, it is possible to efficiently form an adhesive layer that exhibits sufficient cohesive strength and an excellent water barrier capability, and exhibits adhesion and holding power in a well-balanced manner, by curing the adhesive composition. It is possible to obtain cohesive strength sufficient for a sealing material when the number of radiation-curable functional groups is within the above range.
The diene-based rubber (A) is not particularly limited as long as the diene-based rubber (A) includes a radiation-curable functional group. It is preferable that the diene-based rubber (A) be a diene-based rubber that includes a (meth) acryloyl group from the viewpoint of curability.

Examples of such a diene-based rubber (A) include a polybutadiene rubber that includes a (meth)acryloyl group, a polyisoprene rubber that includes a (meth)acryloyl group, a copolymer rubber of butadiene and isoprene that includes a (meth)acryloyl group, a copolymer rubber of butadiene and n-butene that includes a (meth)acryloyl group, and the like. Among these, a polyisoprene rubber that includes a (meth)acryloyl group is preferable as the diene-based rubber (A) due to a capability to efficiently form an adhesive layer that exhibits an excellent water barrier capability and high cohesive strength.

These diene-based rubbers may be used either alone or in combination as the diene-based rubber (A).

Specific examples of a preferable diene-based rubber (A) include a diene-based rubber that includes a polymer that includes a repeating unit represented by the following formula (I) and a repeating unit represented by the following formula (II) in its molecule.

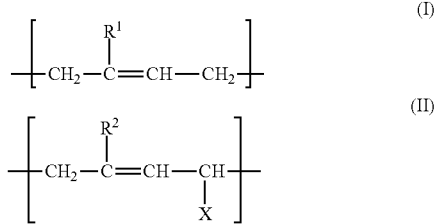

$R^1$ and $R^2$ are independently a hydrogen atom or an alkyl group having 1 to 5 carbon atoms, and preferably a hydrogen atom or an alkyl group having 1 to 3 carbon atoms.

X is a side chain that includes a (meth)acryloyl group. The number of carbon atoms of the side chain is normally 8 to 20, and preferably 9 to 15.

Examples of the alkyl group having 1 to 5 carbon atoms that may be represented by $R^1$ and $R^2$ include a methyl group, an ethyl group, an n-propyl group, an i-propyl group, an n-butyl group, and the like.

Examples of the side chain that includes a (meth)acryloyl group that is represented by X include a side chain represented by the following formula (III).

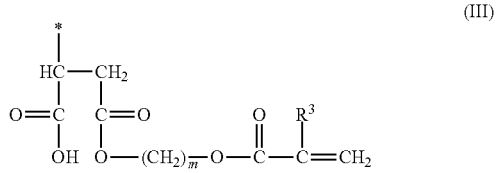

wherein $R^3$ is a hydrogen atom or an alkyl group having 1 to 5 carbon atoms, m is an integer from 1 to 5 (preferably 1 to 3), and "*" is the bonding position.

The polymer that includes the repeating unit represented by the formula (I) and the repeating unit represented by the formula (II) may include only one type of the repeating unit represented by the formula (I), or may include two or more types of the repeating unit represented by the formula (I). The polymer may include only one type of the repeating unit represented by the formula (II), or may include two or more types of the repeating unit represented by the formula (II).

The content of the repeating unit represented by the formula (I) in the diene-based rubber (A) is normally 0.01 to 99.99 mass % based on the total repeating units.

The content of the repeating unit represented by the formula (II) in the diene-based rubber (A) is normally 0.01 to 99.99 mass % based on the total repeating units.

The polymer that includes the repeating unit represented by the formula (I) and the repeating unit represented by the formula (II) may include a repeating unit derived from an additional copolymerizable monomer as long as the advantageous effects of the invention are not impaired.

The content of the repeating unit derived from the additional monomer in the diene-based rubber (A) is normally 0 to 50 mass % based on the total repeating units.

The diene-based rubber (A) may not be hydrogenated (i.e., an unhydrogenated diene-based rubber that includes a (meth)acryloyl group), or may be hydrogenated (i.e., a hydrogenated diene-based rubber that includes a (meth) acryloyl group).

It is preferable that the diene-based rubber (A) be liquid at room temperature (25° C.), but become solid and exhibit rubber elasticity upon crosslinking (i.e., liquid rubber). When the diene-based rubber (A) is a liquid rubber, it is possible to efficiently form an adhesive layer that exhibits an excellent water barrier capability and high cohesive strength.

The number average molecular weight of the diene-based rubber (A) is preferably 1000 to 100,000, more preferably 5000 to 100,000, and still more preferably 10,000 to 60,000. When the number average molecular weight of the diene-based rubber (A) is 1000 or more, it is possible to prevent a situation in which the diene-based rubber (A) bleeds out from the resulting adhesive layer. When the number average molecular weight of the diene-based rubber (A) is 100,000 or less, the diene-based rubber (A) is sufficiently mixed with an additional component when preparing the adhesive composition, and a curing reaction due to application of ionizing radiation (hereinafter may be referred to as "active energy rays") proceeds promptly. Therefore, it is possible to efficiently form an adhesive layer that exhibits an excellent water barrier capability and high cohesive strength.

Note that the number average molecular weight refers to a standard polystyrene-reduced value (standard polystyrene-equivalent value) determined by gel permeation chromatography using tetrahydrofuran as a solvent (hereinafter the same).

The diene-based rubber (A) may be produced by adding maleic anhydride to a polymer such as a polybutadiene, and reacting a (meth)acrylate that includes a hydroxyl group with maleic anhydride (see JP-A-2009-29976), for example.

A commercially available product may be used as the diene-based rubber (A). Examples of a commercially available product that may be used as the diene-based rubber (A) include UC-203 (manufactured by Kuraray Co., Ltd., an esterified oligomer of a maleic anhydride adduct of an isoprene polymer and 2-hydroxyethyl methacrylate), NISSO-PB TEAI-1000 (manufactured by Nippon Soda Co., Ltd., a hydrogenated butadiene-based oligomer that is modified with an acrylate at each terminal), NISSO-PB TE-2000 (manufactured by Nippon Soda Co., Ltd., a butadiene-based oligomer that is modified with a methacrylate at each terminal), and the like.

The content of the diene-based rubber (A) in the adhesive composition is preferably 0.5 mass % or more, more preferably 0.5 to 95.5 mass %, still more preferably 1.0 to 50 mass %, and particularly preferably 2.0 to 20 mass %. When the content of the diene-based rubber (A) in the adhesive composition is 0.5 mass % or more, it is possible to efficiently form a cured adhesive layer. When the content of the diene-based rubber (A) in the adhesive composition is not too high, it is possible to efficiently form a cured adhesive layer that exhibits sufficient adhesion.

Rubber-Based Polymer (B) that does not Include Radiation-Curable Functional Group The adhesive composition according to one embodiment of the invention may include a rubber-based polymer (B) that does not include a radiation-curable functional group (hereinafter may be referred to as "rubber-based polymer (B)").

The term "rubber-based polymer" used herein refers to a resin that exhibits rubber elasticity at 25° C.

When the adhesive composition includes the rubber-based polymer (B), it is possible to form a complex and dense structure in which the rubber-based polymer (B) is intertwined with a structure that is formed by the reaction between the polymers included in the diene-based rubber (A), and efficiently form an adhesive layer that exhibits a high water barrier capability and sufficient adhesion.

It is preferable that the rubber-based polymer (B) be rubber that includes a polymethylene-type saturated main chain, or rubber that includes an unsaturated carbon-carbon bond in the main chain.

Specific examples of the rubber-based polymer (B) include an isobutylene homopolymer (polyisobutylene (IM)), a copolymer of isobutylene and n-butene, natural rubber (NR), a butadiene homopolymer (butadiene rubber (BR)), a chloroprene homopolymer (chloroprene rubber (CR)), an isoprene homopolymer (isoprene rubber (IR)), a copolymer of isobutylene and butadiene, a copolymer of isobutylene and isoprene (butyl rubber (IIR)), a halogenated butyl rubber, a copolymer of styrene and 1,3-butadiene (styrene-butadiene rubber (SBR)), a copolymer of acrylonitrile and 1,3-butadiene (nitrile rubber), a styrene-1,3-butadiene-styrene block copolymer (SBS), a styrene-isoprene-styrene block copolymer (SIS), an ethylene-propylene-nonconjugated diene ternary copolymer, and the like.

These rubber-based polymers may be used either alone or in combination as the rubber-based polymer (B).

Among these, an isobutylene-based polymer such as an isobutylene homopolymer, a copolymer of isobutylene and n-butene, a copolymer of isobutylene and butadiene, and a copolymer of isobutylene and isoprene is preferable, and a copolymer of isobutylene and isoprene is more preferable as the rubber-based polymer (B), due to an excellent water barrier capability, high compatibility with the diene-based rubber (A), and a capability to easily form a uniform adhesive layer.

The number average molecular weight of the rubber-based polymer (B) is preferably 100,000 to 2,000,000, more preferably 100,000 to 1,500,000, and still more preferably 100,000 to 1,000,000.

It is possible to prepare an adhesive composition having moderate fluidity, and easily form an adhesive layer that exhibits sufficient adhesion by utilizing the rubber-based polymer (B) having a number average molecular weight of 100,000 or more. When the rubber-based polymer (B) has a number average molecular weight of 2,000,000 or less, the rubber-based polymer (B) is easily dissolved in a normal organic solvent, and it is possible to efficiently prepare the adhesive composition.

The rubber-based polymer (B) may be produced using a known method such as a method that polymerizes the monomer in the presence of a Lewis acid catalyst such as aluminum chloride or boron trifluoride.

A commercially available product may also be used as the rubber-based polymer (B). Examples of a commercially available product that may be used as the rubber-based polymer (B) include Exxon Butyl (manufactured by Japan Butyl Co., Ltd.), Vistanex (manufactured by Exxon Chemical Co.), Hycar (manufactured by Goodrich), Oppanol (manufactured by BASF), and the like.

The content of the rubber-based polymer (B) in the adhesive composition is preferably 99.5 mass % or less, more preferably 50 to 99.0 mass %, and still more preferably 60 to 98.0 mass %. When the content of the rubber-based polymer (B) in the adhesive composition is 99.5 mass % or less, it is possible to efficiently form an adhesive layer that exhibits adhesion and holding power in a well-balanced manner, and exhibits an excellent water barrier capability and high cohesive strength.

Photoinitiator (C)

The adhesive composition according to one embodiment of the invention may further include a photoinitiator (C).

It is possible to efficiently cure the adhesive composition according to one embodiment of the invention even when ultraviolet rays are used as the active energy rays, for example.

When the radiation-curable functional group included in the diene-based rubber (A) is an alkenyl group or a (meth)acryloyl group, a radical photoinitiator that decomposes upon irradiation of active energy rays to generate radicals and initiate polymerization is preferable as the photoinitiator (C).

Examples of the radical photoinitiator include benzophenone, acetophenone, benzoin, benzoin methyl ether, benzoin ethyl ether, benzoin isopropyl ether, benzoin isobutyl ether, benzoin benzoate, methyl benzoin benzoate, benzoin dimethyl ketal, 2,4-diethylthioxanthone, 1-hydroxycyclohexyl phenyl ketone, benzyl diphenyl sulfide, tetramethylthiuram monosulfide, azobisisobutyronitrile, 2-chloroanthraquinone, diphenyl(2,4,6-trimethylbenzoyl)phosphine oxide, and bis(2,4,6-trimethylbenzoyl)phenylphosphine oxide.

When using the photoinitiator (C), the photoinitiator (C) is normally used in an amount of 0.1 to 100 parts by mass, and preferably 1 to 100 parts by mass, based on 100 parts by mass of the diene-based rubber (A).

Tackifier (D)

The adhesive composition according to one embodiment of the invention may further include a tackifier (D).

It is possible to efficiently form an adhesive layer that exhibits further improved adhesion by utilizing the adhesive composition that includes the tackifier (D).

The tackifier (D) is not particularly limited as long as the tackifier (D) improves the adhesion of the adhesive layer. A known tackifier may be used as the tackifier (D). Examples of the tackifier (D) include an alicyclic petroleum resin, an aliphatic petroleum resin, a terpene resin, an ester-based resin, a coumarone-indene resin, a rosin-based resin, an epoxy resin, a phenol resin, an acrylic resin, a butyral resin, an olefin resin, a chlorinated olefin resin, a vinyl acetate resin, modified resins or hydrogenated resins thereof, and the like. Among these, an alicyclic petroleum resin, an aliphatic petroleum resin, a terpene resin, and an ester-based resin are preferable. A hydrogenated resin is preferable as the tackifier (D) since an adhesive layer that is rarely discolored even at a high temperature and a high humidity can be formed. The hydrogenated resin may be a partially hydrogenated product, or may be a completely hydrogenated product.

These tackifiers may be used either alone or in combination as the tackifier (D).

The molecular weight of the tackifier (D) is preferably 100 to 10,000, and more preferably 500 to 5000.

The softening point of the tackifier (D) is preferably 50 to 160° C., more preferably 60 to 140° C., and still more preferably 70 to 130° C.

When the softening point of the tackifier (D) is 50° C. or more, it is possible to efficiently form a cured adhesive layer that exhibits adhesion and holding power in a well-balanced manner.

A commercially available product may also be used as the tackifier (D). Examples of a commercially available product that may be used as the tackifier (D) include an aliphatic petroleum resin such as an ESCOREZ 1000 series (manufactured by Exxon Chemical Co., Ltd.), and a Quintone A/B/R/CX series (manufactured by Zeon Corporation); an alicyclic petroleum resin such as an Arkon P/M series (manufactured by Arakawa Chemical Industries, Ltd.), an ESCOREZ series (manufactured by Exxon Chemical Co., Ltd.), an EASTOTAC series (manufactured by Eastman Chemical Company), and an IMARV series (manufactured by Idemitsu Kosan Co., Ltd.); a terpene-based resin such as a YS resin P/A series (manufactured by Yasuhara Chemical Co., Ltd.), a Clearon P series (manufactured by Yasuhara Chemical Co., Ltd.), and a Piccolyte A/C series (manufactured by Hercules); an ester-based resin such as a Foral series (manufactured by Hercules), a Pensel A series (manufactured by Arakawa Chemical Industries, Ltd.), an Ester Gum series (manufactured by Arakawa Chemical Industries, Ltd.), a Super Ester series (manufactured by Arakawa Chemical Industries, Ltd.), and a Pinecrystal series (manufactured by Arakawa Chemical Industries, Ltd.); and the like.

When using the tackifier (D), the tackifier (D) is normally used in an amount of 5 to 70 parts by mass, preferably 10 to 60 parts by mass, and more preferably 10 to 50 parts by mass, based on 100 parts by mass of the diene-based rubber (A) and the rubber-based polymer (B) in total.

When the tackifier (D) is used in an amount of 5 parts by mass or more based on 100 parts by mass of the diene-based rubber (A) and the rubber-based polymer (B) in total, it is possible to efficiently form an adhesive layer that exhibits further improved adhesion. When the tackifier (D) is used in an amount of 70 parts by mass or less based on 100 parts by mass of the diene-based rubber (A) and the rubber-based polymer (B) in total, it is possible to prevent a situation in which the cohesive strength of the adhesive layer decreases.

Additional Component

The adhesive composition according to one embodiment of the invention may include an additional component as long as the advantageous effects of the invention are not impaired.

Examples of the additional component include additives such as a silane coupling agent, an antistatic agent, a light stabilizer, an antioxidant, a UV absorber, a resin stabilizer, a filler, a pigment, an extender, and a softener.

These additives may be used either alone or in combination.

The content of each additional component in the adhesive composition is preferably 0.01 to 5 mass %, and more preferably 0.01 to 2 mass %.

Adhesive Composition

The adhesive composition according to one embodiment of the invention may be prepared by appropriately mixing and stirring the diene-based rubber (A), the rubber-based polymer (B) (optional), the photoinitiator (C) (optional), the tackifier (D) (optional), an optional additional component, a solvent, and the like using a normal method.

Examples of the solvent include an aromatic hydrocarbon-based solvent such as benzene and toluene; an ester-based solvent such as ethyl acetate and butyl acetate; a ketone-based solvent such as acetone, methyl ethyl ketone, and methyl isobutyl ketone; an aliphatic hydrocarbon-based solvent such as n-pentane, n-hexane, and n-heptane; an alicyclic hydrocarbon-based solvent such as cyclopentane and cyclohexane; and the like.

These solvents may be used either alone or in combination.

The solid content in the adhesive composition according to one embodiment of the invention is preferably 10 to 60 mass %, more preferably 10 to 45 mass %, and still more preferably 15 to 30 mass %.

It is possible to efficiently form an adhesive layer that exhibits an excellent water barrier capability and high cohesive strength by utilizing the adhesive composition according to one embodiment of the invention.

2) Adhesive Sheet

An adhesive sheet according to one embodiment of the invention includes an adhesive layer that is formed using the adhesive composition according to one embodiment of the invention. Specific examples of the adhesive sheet according to one embodiment of the invention include adhesive sheets ($\alpha$) to ($\delta$) (see below).

Adhesive sheet ($\alpha$): An adhesive sheet including a curable adhesive layer that is formed using the adhesive composition according to one embodiment of the invention, and a release sheet that is provided on one side or each side of the curable adhesive layer Adhesive sheet ($\beta$): An adhesive sheet including at least a curable adhesive layer that is formed using the adhesive composition according to one embodiment of the invention, and a base sheet Adhesive sheet ($\gamma$): An adhesive sheet including a cured adhesive layer that is formed by curing the adhesive composition according to one embodiment of the invention, and a release sheet that is provided on one side or each side of the cured adhesive layer Adhesive sheet ($\delta$): An adhesive sheet including at least a cured adhesive layer that is formed by curing the adhesive composition according to one embodiment of the invention, and a base sheet Curable Adhesive Layer The curable adhesive layer included in the adhesive sheet ($\alpha$) and the adhesive layer included in the adhesive sheet ($\beta$) are formed using the adhesive composition according to one embodiment of the invention, and have not bee irradiated with the active energy rays.

For example, the curable adhesive layer may be formed by applying the adhesive composition according to one embodiment of the invention to the surface of the release layer of the release sheet, or the base sheet, using a known method, and drying the resulting film.

The adhesive composition may be applied using a spin coating method, a spray coating method, a bar coating method, a knife coating method, a roll coating method, a blade coating method, a die coating method, a gravure coating method, or the like.

The film is dried at 80 to 150° C. for 30 seconds to 5 minutes, for example.

The thickness of the curable adhesive layer is not particularly limited, and may be appropriately determined taking account of the application. The thickness of the curable adhesive layer is preferably 0.5 to 200 more preferably 1 to 100 μm, and still more preferably 3 to 80 μm.

Cured Adhesive Layer

The cured adhesive layer included in the adhesive sheet (γ) and the cured adhesive layer included in the adhesive sheet (δ) are formed by curing the adhesive composition according to one embodiment of the invention (or the curable adhesive layer).

Since the cured adhesive layer has a network-like structure that is formed by the reaction between the polymers included in the diene-based rubber (A), the cured adhesive layer exhibits sufficient cohesive strength and an excellent water barrier capability. When the cured adhesive layer is formed using the adhesive composition that further includes the rubber-based polymer (B), the cured adhesive layer has a complex and dense structure (i.e., interpenetrating polymer network structure) in which the polymer molecules of the rubber-based polymer (B) are intertwined with the network-like structure formed by the reaction between the polymers included in the diene-based rubber (A). Since the cured adhesive layer having such a structure exhibits sufficient cohesive strength, the cured adhesive layer exhibits a further improved water barrier capability, and exhibits adhesion and holding power in a well-balanced manner. It is preferable to form the adhesive sheet according to one embodiment of the invention using the adhesive composition that includes the rubber-based polymer (B) since these advantageous effects can be easily obtained.

The cured adhesive layer may be formed by applying the active energy rays to the curable adhesive layer to cure the curable adhesive layer, for example. The active energy rays may be applied after bringing the curable adhesive layer into contact with an adherend or a second release sheet.

Examples of the active energy rays used to cure the curable adhesive layer include ultraviolet rays, electron beams, and the like.

It is preferable to use ultraviolet rays when it is desired to ensure an excellent device handling capability, and it is preferable to use electron beams when use of a photoinitiator is not desired.

Ultraviolet rays may be generated using a high-pressure mercury lamp, an electrodeless lamp, a xenon lamp, an LED lamp, or the like. Electron beams may be generated using an electron beam accelerator or the like.

The dose of the active energy rays is appropriately selected taking account of the object. When using ultraviolet rays, the irradiance is preferably set to 50 to 1000 mW/cm$^2$, and the dose is preferably set to 50 to 1500 mJ/cm$^2$. When using electron beams, the dose is preferably set to 10 to 1000 krad.

The thickness of the cured adhesive layer is not particularly limited, and may be appropriately determined taking account of the application. The thickness of the cured adhesive layer is preferably 0.5 to 200 μm, more preferably 1 to 100 μm, and still more preferably 5 to 80 μm. When the thickness of the cured adhesive layer is 0.5 μm or more, further improved adhesion can be easily obtained. When the thickness of the cured adhesive layer is 200 μm or less, it is possible to form the cured adhesive layer with high productivity.

The cured adhesive layer exhibits an excellent water barrier capability, and exhibits adhesion and holding power in a well-balanced manner (see above). Therefore, when the cured adhesive layer is used as a sealing material, it is possible to sufficiently prevent entry of water. Moreover, since the sealing material is not easily separated (delaminated) at the bonding interface even when heat or vibrations occur when the device is driven, it is possible to prevent entry of water and the like for a long time.

The cured adhesive layer obtained by curing the adhesive composition according to one embodiment of the invention exhibits an excellent water barrier capability. Specifically, a cured adhesive layer having a thickness of 60 μm that is obtained by curing the adhesive composition according to one embodiment of the invention has a water vapor transmission rate at a temperature of 40° C. and a relative humidity of 90% of 30 g/(m$^2$·day) or less, preferably 10 g/(m$^2$·day) or less, still more preferably 6 g/(m$^2$·day) or less, and yet more preferably 3 g/(m$^2$·day) or less.

The water vapor transmission rate of the cured adhesive layer may be measured using the method described later in connection with the examples. Since the water vapor transmission rate of the cured adhesive layer depends on the thickness of the cured adhesive layer, the water vapor transmission rate of the cured adhesive layer is converted using the thickness of the cured adhesive layer when the thickness of the cured adhesive layer is not 60 μm. For example, when the thickness of the cured adhesive layer is A μm, and the water vapor transmission rate of the cured adhesive layer is B g/(m$^2$·day), the water vapor transmission rate of the cured adhesive layer is converted using the expression "A×B/60".

The water vapor transmission rate of the cured adhesive layer can be controlled by adjusting the number of radiation-curable functional groups included in the diene-based rubber (A), the content of the diene-based rubber (A), and the like.

Whether or not the cured adhesive layer exhibits excellent adhesion is determined by measuring the adhesion of the cured adhesive layer. For example, the adhesive sheet that includes the cured adhesive layer is bonded to an adherend at 23° C. and 50% RH, allowed to stand for 24 hours, and subjected to a peel test at 23° C. and 50% RH using a known tensile tester at a peel rate of 300 mm/min and a peel angle of 180° to measure the adhesion of the cured adhesive layer. When the adherend is a polyethylene terephthalate film, the adhesion of the cured adhesive layer is normally 1 N/25 mm or more, and preferably 2 N/25 mm or more. When the adherend is a glass sheet, the adhesion of the cured adhesive layer is preferably 3 N/25 mm or more.

Whether or not the cured adhesive layer exhibits excellent cohesive strength is determined by measuring the holding power of the cured adhesive layer.

For example, when the adhesive sheet is bonded to a stainless steel sheet (SUS380) so that the bonding area is 25×25 mm to prepare a specimen, and the holding power of the adhesive sheet is measured in accordance with JIS Z 0237 (40° C., dry conditions, load: 9.8 N), it is preferable that the adhesive sheet (cured adhesive layer) does not come off from the stainless steel sheet during a period of 70,000 seconds.

The adhesion and the holding power of the cured adhesive layer may be measured using the methods described later in connection with the examples.

When the adhesive sheet according to one embodiment of the invention does not include the base sheet (e.g., the adhesive sheets (1a) and (1b) described below), it is preferable that the adhesion and the holding power measured using a specimen prepared by lining the adhesive sheet with a polyethylene terephthalate film or the like having a thickness of 50 μm be within the above ranges.

Adhesive Sheet (α)

FIG. 1 illustrates examples of the adhesive sheet (α) (see (a) and (b)).

(a) in FIG. 1 is a cross-sectional view illustrating the layer structure of an adhesive sheet (1a) that includes a curable adhesive layer (2a) that is formed using the adhesive composition according to one embodiment of the invention, and a release sheet (3a) that is provided on one side of the curable adhesive layer (2a).

(b) in FIG. 1 is a cross-sectional view illustrating the layer structure of an adhesive sheet (1b) that includes a curable adhesive layer (2b) that is formed using the adhesive composition according to one embodiment of the invention, and release sheets (3b) and (3c) that are provided on either side of the curable adhesive layer (2b).

The release sheet included in the adhesive sheet (α) is not particularly limited. For example, a release sheet that includes a base, and a release layer that is provided on the base, may be used.

Examples of the base used to produce the release sheet include a paper base such as glassine paper, coated paper, and high-quality paper; laminated paper obtained by laminating a thermoplastic resin (e.g., polyethylene) on such a paper base; a plastic film formed of a polyethylene terephthalate resin, a polybutyrene terephthalate resin, a polyethylene naphthalate resin, a polypropylene resin, a polyethylene resin, or the like; and the like.

Examples of a release agent that is used to form the release layer include a silicone-based resin, an olefin-based resin, a rubber-based elastomer (e.g., isoprene-based resin and butadiene-based resin), a long-chain alkyl-based resin, an alkyd-based resin, a fluorine-based resin, and the like.

The thickness of the release sheet is not particularly limited, but is normally 20 to 200 μm, and preferably 25 to 150 μm.

The release sheet may be a double-sided release sheet in which the release layer is formed on each side of the base, or may be a single-sided release sheet in which the release layer is formed on one side of the base. It is preferable to use the double-sided release sheet when producing the adhesive sheet (1a). The adhesive sheet (1a) can be wound in the shape of a roll, and stored when the double-sided release sheet is used.

The adhesive sheet (1a) can be obtained by forming the curable adhesive layer on a first release sheet using the above method.

The adhesive sheet (1b) can be obtained by bonding a second release sheet to the surface of the curable adhesive layer of the adhesive sheet (1a).

The second release sheet may be either identical with or different from the first release sheet. It is preferable that the second release sheet require a peel force differing from that of the first release sheet from the viewpoint of workability when removing (peeling) the release sheet.

A cured adhesive layer that exhibits an excellent water barrier capability, and exhibits adhesion and holding power in a well-balanced manner, can be formed by curing the curable adhesive layer included in the adhesive sheet (α). Therefore, the adhesive sheet (α) may preferably be used to form a sealing material for an electronic device.

Examples of the electronic device include an organic device such as an organic transistor, an organic memory, and an organic EL device, a liquid crystal display, electronic paper, a thin film transistor, an electrochromic device, an electrochemical light-emitting device, a touch panel, a solar cell, a thermoelectric conversion device, a piezoelectric conversion device, an electrical storage device, and the like. Among these, an organic EL device and electronic paper are preferable since it is possible to take full advantage of the characteristics of the cured adhesive layer.

When forming a sealing material for an electronic device using the adhesive sheet (α), the curable adhesive layer of the adhesive sheet (α) is bonded to an adherend (e.g., the electrode of an organic EL device), the release sheet is removed after applying the active energy rays, and the adhesive layer is bonded to another adherend so that the cured adhesive layer that exhibits excellent adhesion and an excellent water barrier capability, and functions as a sealing material is provided on the surface of the adherend, for example. Alternatively, the curable adhesive layer of the adhesive sheet (α) is bonded to an adherend, and the release sheet is removed. After bonding a second adherend to the exposed curable adhesive layer, the active energy rays are applied to the curable adhesive layer so that the cured adhesive layer is provided on the surface of the adherend.

The adhesive sheet (α) may preferably be used as a material for producing the adhesive sheet (β) or (γ) (described below).

Adhesive Sheet (β)

Figure 2:
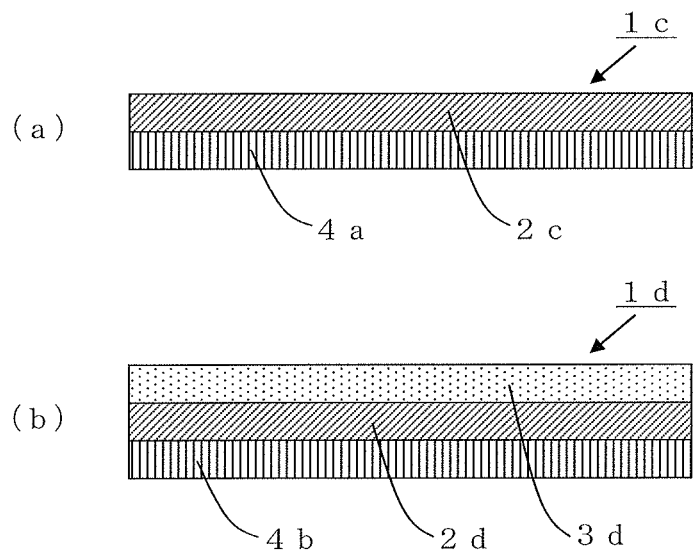
FIG. 2 is a view illustrating an example of the layer configuration of an adhesive sheet according to one embodiment of the invention.

FIG. 2 illustrates examples of the adhesive sheet (β) (see (a) and (b)).

(a) in FIG. 2 is a cross-sectional view illustrating the layer structure of an adhesive sheet (1c) that includes a curable adhesive layer (2c) that is formed using the adhesive composition according to one embodiment of the invention, and a base sheet (4a).

(b) in FIG. 2 is a cross-sectional view illustrating the layer structure of an adhesive sheet (1d) that includes a curable adhesive layer (2d) that is formed using the adhesive composition according to one embodiment of the invention, a base sheet (4b), and a release sheet (3d).

The base sheet included in the adhesive sheet (β) is not particularly limited as long as the base sheet can support the curable adhesive layer.

A film or a sheet formed of a resin (e.g., polyimide, polyamide, polyamide-imide, polyphenylene ether, polyether ketone, polyether ether ketone, polyolefin, polyester (e.g., polyethylene terephthalate), polycarbonate, polysulfone, polyether sulfone, polyphenylene sulfide, polyarylate, acrylic-based resin, cycloolefin-based polymer, aromatic-based polymer, or polyurethane-based polymer), a metal foil (e.g., aluminum foil), a laminate thereof, or the like may be used as the base sheet.

The thickness of the base sheet is not particularly limited, but is preferably 0.5 to 500 μm, more preferably 1 to 200 μm, and still more preferably 5 to 100 μm, from the viewpoint of ease of handling.

The base sheet may include a UV absorber, a light stabilizer, an antioxidant, an antistatic agent, a slipping agent, an antiblocking agent, a coloring agent, and the like. The surface of the base sheet may optionally be subjected to a surface treatment in order to improve adhesion between the base sheet and the curable adhesive layer.

A gas barrier layer may be formed on the base sheet either directly or through an additional layer in order to provide the base sheet with a gas barrier capability.

The thickness of the gas barrier layer is not particularly limited, but is normally 10 to 2000 nm, preferably 20 to 1000 nm, more preferably 30 to 500 nm, and still more preferably 40 to 200 nm, from the viewpoint of gas barrier capability and handling capability.

The gas barrier layer may include a single layer, or may include a plurality of layers. It is preferable that the gas barrier layer include a plurality of layers since a higher gas barrier capability can be obtained.

A material for forming the gas barrier layer and the like are not particularly limited as long as it is possible to provide the gas barrier layer with the desired gas barrier capability. Examples of the gas barrier layer include an inorganic film, a gas barrier layer obtained by implanting ions into a layer that includes a polymer compound, a metal film (e.g., aluminum film), and the like.

It is preferable that the gas barrier layer be a gas barrier layer that is formed of an inorganic film, or a gas barrier layer obtained by implanting ions into a layer that includes a polymer compound, since it is possible to efficiently form a layer that is thin, and exhibits an excellent gas barrier capability.

The inorganic film is not particularly limited. Examples of the inorganic film include an inorganic deposited film.

Examples of the inorganic deposited film include an inorganic deposited film obtained by depositing an inorganic compound, and an inorganic deposited film obtained by depositing a metal.

Examples of the inorganic compound used as the raw material for forming the inorganic deposited film include an inorganic oxide such as silicon oxide, aluminum oxide, magnesium oxide, zinc oxide, indium oxide, and tin oxide; an inorganic nitride such as silicon nitride, aluminum nitride, and titanium nitride; an inorganic carbide; an inorganic sulfide; an inorganic oxynitride such as silicon oxynitride; an inorganic oxycarbide; an inorganic carbonitride; an inorganic oxycarbonitride; and the like.

Examples of the metal used as the raw material for forming the inorganic deposited film include aluminum, magnesium, zinc, tin, and the like.

These materials may be used either alone or in combination.

An inorganic deposited film that is formed using an inorganic oxide, an inorganic nitride, or a metal as the raw material is preferable from the viewpoint of gas barrier capability. An inorganic deposited film that is formed using an inorganic oxide or an inorganic nitride as the raw material is preferable from the viewpoint of transparency.

The inorganic deposited film may be formed using a physical vapor deposition (PVD) method such as a vacuum deposition method, a sputtering method, or an ion plating method, or a chemical vapor deposition (CVD) method such as a thermal CVD method, a plasma CVD method, or a photo-CVD method, for example.

Examples of the polymer compound used when forming the gas barrier layer by implanting ions into the layer that includes the polymer compound (hereinafter may be referred to as "polymer layer") include a silicon-containing polymer compound (e.g., polyorganosiloxane and polysilazane-based compound), a polyimide, a polyamide, a polyamide-imide, a polyphenylene ether, a polyether ketone, a polyether ether ketone, a polyolefin, a polyester, a polycarbonate, a polysulfone, a polyether sulfone, a polyphenylene sulfide, a polyallylate, an acrylic-based resin, a cycloolefin-based polymer, an aromatic polymer, and the like. These polymer compounds may be used either alone or in combination.

Among these, a polysilazane-based compound is preferable since a gas barrier layer that exhibits an excellent gas barrier capability can be formed. A product commercially available as a glass coating material or the like may be used directly as the polysilazane-based compound.

The polysilazane-based compounds may be used either alone or in combination.

The polymer layer may include an additional component other than the polymer compound as long as the object of the invention is not impaired. Examples of the additional component include a curing agent, an additional polymer, an aging preventive, a light stabilizer, a flame retardant, and the like.

The polymer layer may be formed by applying a layer-forming solution that includes at least one polymer compound, an optional additional component, a solvent, and the like using a known device (e.g., spin coater, knife coater, or gravure coater), and appropriately drying the resulting film, for example.

Examples of the ions implanted into the polymer layer include ions of a rare gas such as argon, helium, neon, krypton, and xenon; ions of a fluorocarbon, hydrogen, nitrogen, oxygen, carbon dioxide, chlorine, fluorine, sulfur, and the like; ions of an alkane-based gas such as methane and ethane; ions of an alkene-based gas such as ethylene and propylene; ions of an alkadiene-based gas such as pentadiene and butadiene; ions of an alkyne-based gas such as acetylene; ions of an aromatic hydrocarbon-based gas such as benzene and toluene; ions of a cycloalkane-based gas such as cyclopropane; ions of a cycloalkene-based gas such as cyclopentene; ions of a metal; ions of an organosilicon compound; and the like.

These ions may be used either alone or in combination.

It is preferable to use ions of a rare gas such as argon, helium, neon, krypton, or xenon due to ease of ion implantation and a capability to form a gas barrier layer that exhibits a particularly excellent gas barrier capability.

The ions may be implanted using an arbitrary method. For example, the ions may be implanted by applying ions (ion beams) accelerated using an electric field, implanting ions present in plasma (plasma ion implantation method), or the like. It is preferable to use the plasma ion implantation method since a gas barrier film can be easily obtained.

Examples of an additional layer that may be included in the gas barrier film include a protective layer, a conductive layer, a primer layer, and the like. The additional layer may be situated (stacked) at an arbitrary position.

The water vapor transmission rate of the gas barrier film at 40° C. and 90% RH (relative humidity) is preferably 0.5 $g/(m^2 \cdot day)$ or less, and more preferably 0.05 $g/(m^2 \cdot day)$ or less.

The water vapor transmission rate of the gas barrier film may be measured using a known gas transmission rate measurement apparatus.

The adhesive sheet ($\beta$) may include an additional layer in addition to the curable adhesive layer and the base sheet. Examples of the additional layer include a protective layer, a conductive layer, a primer layer, a release sheet, and the like. The release sheet may be a release sheet similar to that included in the adhesive sheet ($\alpha$).

The adhesive sheet ($\beta$) can be obtained by forming the curable adhesive layer on the base sheet using the above method, or producing the adhesive sheet (1$a$), and bonding the curable adhesive layer of the adhesive sheet (1$a$) to the base sheet.

A cured adhesive layer that exhibits an excellent water barrier capability, and exhibits adhesion and holding power in a well-balanced manner, can be formed by curing the curable adhesive layer included in the adhesive sheet ($\beta$). Therefore, the adhesive sheet ($\beta$) may preferably be used to form a sealing material for an electronic device in the same manner as the adhesive sheet ($\alpha$).

Examples of the electronic device include those mentioned above.

When forming a sealing material for an electronic device using the adhesive sheet ($\beta$), the curable adhesive layer of the adhesive sheet ($\beta$) is bonded to an adherend (e.g., the electrode of an organic EL device), and the active energy rays are applied to the curable adhesive layer so that a sealing material that exhibits excellent adhesion to the adherend and an excellent water barrier capability is provided on the surface of the adherend.

The cured adhesive layer thus formed exhibits excellent adhesion to the base sheet, and is rarely delaminated at the interface with the base sheet. These characteristics are particularly advantageous when using a gas barrier film that exhibits a very high gas barrier capability as the base sheet (described below).

Adhesive Sheet (γ)

The adhesive sheet (γ) is obtained by curing the curable adhesive layer included in the adhesive sheet (α).

The cured adhesive layer included in the adhesive sheet (γ) exhibits an excellent water barrier capability, and exhibits adhesion and holding power in a well-balanced manner. Therefore, the adhesive sheet (γ) may preferably be used to form a sealing material for an electronic device in the same manner as the adhesive sheets (α) and (β). In particular, the adhesive sheet (γ) may preferably be used to form a sealing material for an organic EL device.

When forming a sealing material for an electronic device using the adhesive sheet (γ), the cured adhesive layer of the adhesive sheet (γ) is bonded to an adherend (e.g., the electrode of an organic EL device), and the release sheet is removed so that the cured adhesive layer that exhibits excellent adhesion to the adherend and an excellent water barrier capability, and functions as a sealing material is provided on the surface of the adherend, for example.

Adhesive Sheet (δ)

The adhesive sheet (δ) is obtained by curing the curable adhesive layer included in the adhesive sheet (β).

The cured adhesive layer included in the adhesive sheet (δ) exhibits an excellent water barrier capability, and exhibits adhesion and holding power in a well-balanced manner. Therefore, the adhesive sheet (δ) exhibits excellent adhesion between the base sheet and the cured adhesive layer. These characteristics are particularly advantageous when using a gas barrier film that exhibits a very high gas barrier capability as the base sheet. Specifically, since the adhesive sheet (δ) suppresses entry of water and the like from the bonding interface between the base sheet and the adhesive layer, the very high performance of the gas barrier film is reflected directly in the adhesive sheet (δ).

Therefore, the adhesive sheet (δ) may preferably be used to form a sealing material for an electronic device in the same manner as the adhesive sheets (α) to (γ). In particular, the adhesive sheet (δ) may preferably be used to form a sealing material for an organic EL device.

When forming a sealing material for an electronic device using the adhesive sheet (δ), the cured adhesive layer of the adhesive sheet (δ) is bonded to an adherend (e.g., electrode of an organic EL device) so that the sealing material and the base sheet are provided on the surface of the adherend.

3) Electronic Device

An electronic device according to one embodiment of the invention includes a sealing material, the sealing material being formed using the adhesive composition according to one embodiment of the invention.

Examples of the electronic device include an organic device such as an organic transistor, an organic memory, and an organic EL device, a liquid crystal display, electronic paper, a thin film transistor, an electrochromic device, an electrochemical light-emitting device, a touch panel, a solar cell, a thermoelectric conversion device, a piezoelectric conversion device, an electrical storage device, and the like.

Figure 3:
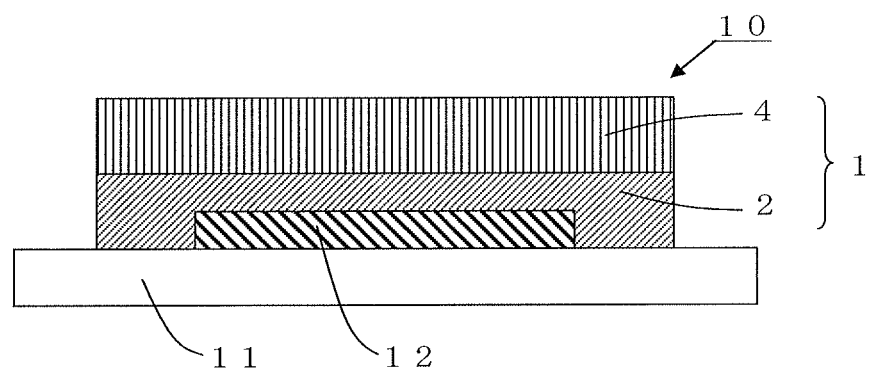
FIG. 3 is a view illustrating an example of an electronic device according to one embodiment of the invention.

FIG. 3 illustrates the structure of an organic EL device as an example of the electronic device according to one embodiment of the invention.

An organic EL device 10 includes a glass substrate 11, and a structure 12 that is formed on the glass substrate 11. The structure 12 is formed by stacking a transparent electrode, a hole-transporting layer, an emitting layer, a bottom electrode, and the like (not illustrated in FIG. 3). An adhesive sheet 1 that includes a cured adhesive layer 2 and a base sheet 4 is laminated (stacked) on the structure 12 and the glass substrate 11.

Since the organic EL device 10 is configured so that the structure 12 is covered with the cured adhesive layer 2, entry of water and the like is suppressed, and a situation does not occur in which the adhesive layer 2 is displaced or delaminated from the structure 12 due to heat or vibrations that occur when the electronic device is driven. In particular, when a gas barrier film that exhibits an excellent gas barrier capability is used as the base sheet 4, delamination rarely occurs at the interface between the cured adhesive layer 2 and the gas barrier film (base sheet 4), and it is possible to take full advantage of the performance of the gas barrier film.

EXAMPLES

The invention is further described below by way of examples. Note that the invention is not limited to the following examples.

Note that the units "parts" and "%" used in connection with the examples respectively refer to "parts by mass" and "mass %" unless otherwise indicated.

Compound

The compounds and the materials shown below were used in the examples.

Diene-based rubber (A1): methacryloyl group-containing polyisoprene rubber represented by the following formula (IV) ("UC-203" manufactured by Kuraray Co., Ltd., number average molecular weight: 36,000, number of methacryloyl groups per molecule: 3)

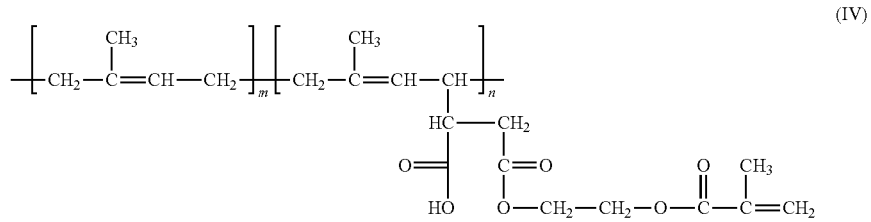

(IV)

Rubber-based polymer (B1): isobutylene-based polymer ("Exxon Butyl 268" manufactured by Japan Butyl Co., Ltd., number average molecular weight: 260,000)
Photoinitiator (C1): phosphorus-based photoinitiator ("Lucirin TPO" manufactured by BASF)
Tackifier (D1): aliphatic petroleum resin ("Quintone A100" manufactured by Zeon Corporation, softening point: 100° C.)
Monomer (1): butyl acrylate
Monomer (2): acrylic acid
Initiator (1): azobisisobutyronitrile
Crosslinking agent (1): ethyl acetate solution of trimethylolpropane-modified tolylene diisocyanate ("Coronate L" manufactured by Nippon Polyurethane Industry Co., Ltd., solid content: 75 mass %)
Base sheet (1): laminate film in which a polyethylene terephthalate film (12 μm) is bonded to each side of an aluminum foil (7 μm) using a urethane-based adhesive (manufactured by Asia Alumi Co., Ltd.)
Release sheet (1): easy release sheet (polyethylene terephthalate film subjected to a silicone release treatment) ("SP-PET381130" manufactured by Lintec Corporation, thickness: 38 μm)
Release sheet (2): tight release sheet (polyethylene terephthalate film subjected to a silicone release treatment) ("SP-PET38T103-1" manufactured by Lintec Corporation, thickness: 38 μm)

Note that the average molecular weight of the diene-based rubber (A1) and the rubber-based polymer (B1) was determined as a standard polystyrene-reduced value (standard polystyrene-equivalent value) by performing gel permeation chromatography under the following conditions.
Device: HLC-8020 (manufactured by Tosoh Corporation)
Column: TSK guard column HXL-H, TSK gel GMHXL(× 2), TSK gel G2000HXL (manufactured by Tosoh Corporation)
Column temperature: 40° C.
Eluant: tetrahydrofuran
Flow rate: 1.0 mL/min The softening point of the tackifier (D1) was measured in accordance with JIS K 2531.

Example 1

Preparation of Adhesive Composition 5 parts of the diene-based rubber (A1), 100 parts of the rubber-based polymer (B1), 5 parts of the photoinitiator (C1), and 20 parts of the tackifier (D1) were dissolved in toluene to prepare an adhesive composition (1) having a solid content of about 25%.
Production 1 of Adhesive Sheet The adhesive composition (1) was applied to the base sheet (1) so that the thickness after drying was 20 μm, and the resulting film was dried at 110° C. for 1 minute to form a curable adhesive layer. The release-treated surface of the release sheet (1) was bonded to the curable adhesive layer. Ultraviolet rays were applied to the curable adhesive layer through the release sheet (1) using a metal halide lamp (irradiance: 400 mW/cm$^2$, dose: 1000 mJ/cm$^2$) (UV irradiation treatment) to cure the curable adhesive layer to obtain an adhesive sheet (1A) including a cured adhesive layer.
Production 2 of Adhesive Sheet The adhesive composition (1) was applied to the release-treated surface of the release sheet (2) so that the thickness after drying was 60 μm, and the resulting film was dried at 120° C. for 2 minutes to form a curable adhesive layer. The release-treated surface of the release sheet (1) was bonded to the curable adhesive layer. Ultraviolet rays were applied to the curable adhesive layer through the release sheet (1) using a metal halide lamp (irradiance: 400 mW/cm$^2$, dose: 1000 mJ/cm$^2$ (measured using a UV meter ("UV-PF36" manufactured by Eye Graphics Co., Ltd.) (UV irradiation treatment) to cure the curable adhesive layer to obtain an adhesive sheet (1B) including a cured adhesive layer.
Production of Organic EL Device An indium tin oxide (ITO) film (thickness: 150 nm, sheet resistance: 30 Ω/sq) was formed on the surface of a glass substrate using a sputtering method, and subjected to a solvent washing treatment and a UV/ozone treatment to form an anode.

N,N'-Bis(naphthalen-1-yl)-N,N'-bis(phenyl)-benzidine) (manufactured by Luminescence Technology) (60 nm), tris (8-hydroxyquinolinato)aluminum (manufactured by Luminescence Technology) (40 nm), 2,9-dimethyl-4,7-diphenyl-1,10-phenanthroline (manufactured by Luminescence Technology) (10 nm), and (8-hydroxyquinolinolato)lithium (manufactured by Luminescence Technology) (10 nm) were sequentially deposited on the anode (ITO film) at a deposition rate of 0.1 to 0.2 nm/s to form an emitting layer.

Aluminum (Al) (manufactured by Kojundo Chemical Lab. Co., Ltd.) (100 nm) was deposited on the emitting layer at a deposition rate of 0.1 nm/s to form a cathode.

Note that the degree of vacuum during deposition was set to 1×10$^{-4}$ Pa or less.

The adhesive sheet (1A) was dried by heating at 120° C. for 30 minutes in a nitrogen atmosphere using a hot plate, and allowed to cool to room temperature. After removing the release sheet (1) from the adhesive sheet (1A), the exposed adhesive layer was laminated on the cathode so as to cover the entirety of the cathode to obtain an organic EL device (1).

Examples 2 to 6 and Comparative Examples 1 and 2

Adhesive compositions (2) to (8) were prepared in the same manner as in Example 1, except that each component and the amount of each component were changed as shown in Table 1, and adhesive sheets (2A) to (8A), adhesive sheets (2B) to (8B), and organic EL devices (2) to (8) were obtained in the same manner as in Example 1, except that the resulting adhesive composition was used.

Note that the UV irradiation treatment was not performed in Comparative Examples 1 and 2.

Comparative Example 3

A reactor was charged with 90 parts of the monomer (1), 10 parts of the monomer (2), and 0.2 parts of the initiator (1), and the components were mixed. The resulting mixture was deaerated by bubbling nitrogen gas for 4 hours, and heated to 60° C. with stirring. The mixture was stirred at 60° C. for 24 hours to effect a polymerization reaction. The reaction mixture was diluted with ethyl acetate to obtain an ethyl acetate solution of an acrylic-based copolymer (weight average molecular weight: 650,000) (solid content: 33%).

After the addition of the crosslinking agent (1) so that the amount of solid was 1.5 parts based on 100 parts of the solid included in the ethyl acetate solution, toluene was added to the mixture to obtain an adhesive composition (9) having a solid content of 20%.

An adhesive sheet (9A), an adhesive sheet (9B), and an organic EL device (9) were obtained in the same manner as in Example 1, except that the adhesive composition (9) was used instead of the adhesive composition (1).

The adhesive sheets and the organic EL devices obtained in the examples and the comparative examples were subjected to the following measurements, and evaluated as described below. The measurement results and the evaluation results are shown in Table 1.

Measurement of Water Vapor Transmission Rate

After removing the release sheets (1) and (2) from the adhesive sheet ((1B) to (9B)), the adhesive sheet was bonded to a polyethylene terephthalate film (manufactured by Mitsubishi Plastics Inc., thickness: 6 μm) to obtain a water vapor transmission rate measurement sample in which the cured adhesive layer (thickness: 60 μm) was situated between two polyethylene terephthalate films. The water vapor transmission rate of the cured adhesive layer included in the sample was measured at 40° C. and 90% RH using a water vapor transmission rate measurement apparatus ("L80-5000" manufactured by LYSSY).

Measurement of Adhesion

The adhesive sheet (1A) to (9A)) was cut to dimensions of 25×300 mm. After removing the release sheet (1), the exposed adhesive layer was bonded to an adherend (see below) at 23° C. and 50% RH, and the adhesive sheet and the adherend were compression-bonded by reciprocating a roller having a weight of 2 kg by one stroke to obtain a specimen.

After allowing the specimen to stand at 23° C. and 50% RH for 24 hours, the specimen was subjected to a peel test at 23° C. and 50% RH using a tensile tester ("Tensilon" manufactured by Orientec Co., Ltd.) at a peel rate of 300 mm/min and a peel angle of 180° to measure the adhesion (N/25 mm) of the specimen.

The following adherends were used for the measurement of adhesion.
PET film: "Cosmoshine A4100" manufactured by Toyobo Co., Ltd., thickness: 50 μm Glass sheet (soda-lime glass): product manufactured by Nippon Sheet Glass Co., Ltd.

Measurement of Holding Power

The adhesive sheet (1A) to (9A)) was cut to dimensions of 25×300 mm. After removing the release sheet (1), the exposed adhesive layer was bonded to a stainless steel sheet (SUS380) at 23° C. and 50% RH so that the bonding area was 25×25 mm, and the adhesive sheet and the stainless steel sheet were compression-bonded by reciprocating a roller having a weight of 2 kg by one stroke to obtain a specimen.

The holding power of the adhesive sheet was measured in accordance with JIS Z 0237 (40° C., dry conditions, load: 9.8 N) using the resulting specimen to determine whether or not the adhesive sheet came off from the stainless steel sheet during a period of 70,000 seconds. In Table 1, a case where the adhesive sheet did not come off from the stainless steel sheet is indicated by "NC", and a case where the adhesive sheet came off from the stainless steel sheet is indicated by "C". The value in the parenthesis represents the amount (mm) by which the adhesive sheet came off.

Water Entry Test

A calcium layer having a length of 32 mm, a width of 40 mm, and a thickness of 100 nm was formed on an alkali-free glass substrate (manufactured by Corning, 45×45 mm) using a vacuum deposition method.

After removing the release sheet (1) from the adhesive sheet (1A) to (9A)), the exposed adhesive layer was bonded to the calcium layer formed on the glass substrate in a nitrogen atmosphere using a laminator to obtain a water entry test specimen in which the calcium layer was sealed.

The resulting specimen was allowed to stand at 60° C. and 90% RH for 170 hours, and the degree of discoloration of the calcium layer (i.e., the degree of entry of water) was observed with the naked eye. The water barrier capability was evaluated in accordance with the following standard.

Evaluation Standard

A: Less than 20% (area ratio) of the calcium layer was discolored.
B: 20% or more and less than 40% (area ratio) of the calcium layer was discolored.
C: 40% or more (area ratio) of the calcium layer was discolored.

Evaluation of Organic EL Device

The organic EL device ((1) to (9)) was allowed to stand at 23° C. and 50% RH for 200 hours, and driven to observe the presence or absence of a dark spot (i.e., an area in which light was not emitted). The organic EL device was evaluated in accordance with the following standard.

A: The ratio of a dark spot area was less than 5% with respect to the emission area.
B: The ratio of a dark spot area was 5% or more and less than 10% with respect to the emission area.
C: The ratio of a dark spot area was 10% or more and less than 90% with respect to the emission area.
D: The ratio of a dark spot area was 90% or more with respect to the emission area.

TABLE 1

|  |  | Example | | | | | | Comparative Example | | |
| --- | --- | --- | --- | --- | --- | --- | --- | --- | --- | --- |
|  |  | 1 | 2 | 3 | 4 | 5 | 6 | 1 | 2 | 3 |
| Adhesive composition (parts) | Diene-based rubber (A1) | 5 | 10 | 15 | 20 | 100 | 100 | — | — | — |
|  | Rubber-based polymer (B1) | 100 | 100 | 100 | 100 | — | — | 100 | 100 |  |
|  | Photoinitiator (C1) | 5 | 5 | 5 | 5 | 5 | 5 | — | — |  |
|  | Tackifier (D1) | 20 | 20 | 20 | 20 | — | 20 | — | 20 |  |
|  | Acrylic-based copolymer | — | — | — | — | — | — | — | — | 100 |
|  | Crosslinking agent (1) | — | — | — | — | — | — | — | — | 1.5 |
| Adhesion (N/25 mm) | PET film | 8.0 | 7.2 | 5.4 | 4.0 | 1.5 | 4.8 | 2.9 | 13.8 | 11.6 |
|  | Glass sheet | 7.2 | 5.6 | 4.8 | 3.5 | 3.3 | 5.2 | 0.6 | 7.2 | 10.2 |
| Water vapor transmission rate (g/(m² · day)) |  | 3.6 | 4.1 | 5.0 | 5.2 | 28 | 28 | 2.1 | 3.1 | 98 |
| Holding power (mm) |  | NC | NC | NC | NC | NC | NC | C (6) | C (2) | NC |
| Water entry test |  | A | A | A | A | B | B | B | B | C |
| Evaluation of organic EL device |  | A | B | B | B | B | B | C | C | D |

The following were confirmed from the results shown in Table 1.

A cured adhesive layer that exhibited a good water barrier capability and good holding power, and exhibited adhesion and holding power in a well-balanced manner could be formed using the adhesive compositions of Examples 1 to 6. In particular, the adhesive sheets (1B) to (4B) of Examples 1 to 4 that were formed using the diene-based rubber (A1) and the rubber-based polymer (B1) exhibited a very good water barrier capability. The adhesive sheets (1A) to (4A) including the cured adhesive layer and the gas barrier film exhibited high performance when subjected to the water entry test, and the organic EL devices (1) to (4) respectively including the adhesive sheets (1A) to (4A) exhibited high durability.

In contrast, the adhesive sheet (9B) of Comparative Example 3 that was formed using the acrylic-based adhesive had a high water vapor transmission rate, and the water barrier capability of the adhesive sheet (9A) and the durability of the organic EL device (9) were poor.

The adhesive sheets (7B) and (8B) that were respectively formed using the adhesive compositions of Comparative Examples 1 and 2 had a low water vapor transmission rate, but exhibited low holding power, and the balance between adhesion and holding power was poor. Therefore, it was impossible to take full advantage of the performance of the gas barrier film, and the organic EL devices (7) and (8) exhibited poor durability.

REFERENCE SIGNS LIST 1, 1a, 1b, 1c, 1d: Adhesive sheet
2, 2a, 2b, 2c, 2d: Adhesive layer
3a, 3b, 3c, 3d: Release sheet
4, 4a, 4b: Base sheet
10: Organic EL device
11: Glass substrate
12: Structure

The invention claimed is:

1. An adhesive sheet comprising a cured adhesive layer and a release sheet that is provided on one side or each side of the cured adhesive layer,
   a water vapor transmission rate calculated by an expression "A×B/60" is 30 g/(m²·day) or less, wherein A is a thickness of the cured adhesive layer [μm] and B is a water vapor transmission rate of the cured adhesive layer at a temperature of 40° C. and a relative humidity of 90% [g/(m²·day)], and
   the cured adhesive layer being formed by curing an adhesive composition comprising a diene-based rubber (A) that includes a radiation-curable functional group and a rubber-based polymer (B) that does not include a radiation-curable functional group, wherein,
   the diene-based rubber (A) is a polyisoprene rubber that includes a (meth)acryloyl group,
   the diene-based rubber (A) has a number average molecular weight (Mn) of 10,000 to 60,000,
   the rubber-based polymer (B) is an isobutylene homopolymer, a copolymer of isobutylene and n-butene, a copolymer of isobutylene and butadiene, or a copolymer of isobutylene and isoprene,
   the rubber-based polymer (B) has a number average molecular weight (Mn) of 100,000 to 2,000,000, and
   the amount of the diene-based rubber (A) is 5 to 20 parts by mass based on 100 parts by mass of the rubber-based polymer (B);

wherein the diene-based rubber (A) comprises a polymer that comprises a repeating unit represented by a formula (I) and a repeating unit represented by a formula (II) in its molecule,

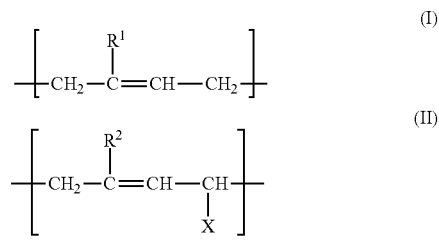

wherein $R^1$ and $R^2$ are independently a hydrogen atom or an alkyl group having 1 to 5 carbon atoms, X is a group represented by a formula (III),

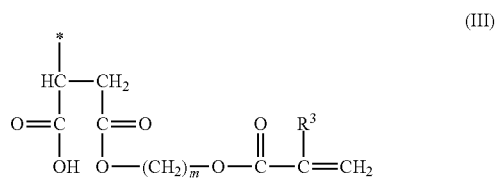

$R^3$ is a hydrogen atom or an alkyl group having 1 to 5 carbon atoms, m is an integer from 1 to 5, and "*" is a bonding position.

2. An adhesive sheet comprising a cured adhesive layer and a base sheet,
   a water vapor transmission rate calculated by an expression "A×B/60" is 30 g/(m²·day) or less, wherein A is a thickness of the cured adhesive layer [μm] and B is a water vapor transmission rate of the cured adhesive layer at a temperature of 40° C. and a relative humidity of 90% [g/(m²·day)], and
   the cured adhesive layer being formed by curing an adhesive composition comprising a diene-based rubber (A) that includes a radiation-curable functional group and a rubber-based polymer (B) that does not include a radiation-curable functional group, wherein,
   the diene-based rubber (A) is a polyisoprene rubber that includes a (meth)acryloyl group,
   the diene-based rubber (A) has a number average molecular weight (Mn) of 10,000 to 60,000,
   the rubber-based polymer (B) is an isobutylene homopolymer, a copolymer of isobutylene and n-butene, a copolymer of isobutylene and butadiene, or a copolymer of isobutylene and isoprene,
   the rubber-based polymer (B) has a number average molecular weight (Mn) of 100,000 to 2,000,000, and
   the amount of the diene-based rubber (A) is 5 to 20 parts by mass based on 100 parts by mass of the rubber-based polymer (B);
   wherein the diene-based rubber (A) comprises a polymer that comprises a repeating unit represented by a formula (I) and a repeating unit represented by a formula (II) in its molecule,

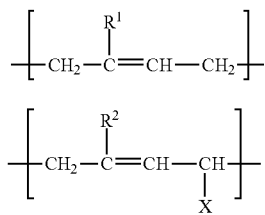 (I)

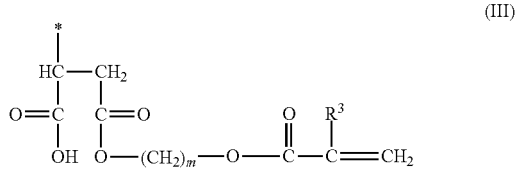 (II)

wherein $R^1$ and $R^2$ are independently a hydrogen atom or an alkyl group having 1 to 5 carbon atoms, X is a group represented by a formula (III), $$\underset{\underset{OH}{|}}{\overset{*}{HC}}-\underset{\underset{O-(CH_2)_m-O-\overset{O}{\overset{||}{C}}-\underset{\underset{}{}}{\overset{R^3}{C}}=CH_2}{}}{CH_2} \quad (III)$$

$R^3$ is a hydrogen atom or an alkyl group having 1 to 5 carbon atoms, m is an integer from 1 to 5, and "*" is a bonding position.

3. The adhesive sheet according to claim 1, wherein the adhesive composition comprises a photoinitiator (C).

4. The adhesive sheet according to claim 1, wherein the adhesive composition comprises a tackifier (D).

5. The adhesive sheet according to claim 1, wherein the tackifier (D) is an alicyclic petroleum resin, an aliphatic petroleum resin, a terpene resin, or an ester-based resin.

6. The adhesive sheet according to claim 1, wherein a molecular weight of the tackifier (D) is 500 to 5000.

7. The adhesive sheet according to claim 1, wherein a softening point of the tackifier (D) is 70 to 130° C.

8. The adhesive sheet according to claim 1, wherein the tackifier (D) is used in an amount of 5 to 70 parts by mass based on 100 parts by mass of the diene-based rubber (A) and the rubber-based polymer (B) in total.

9. The adhesive sheet according to claim 1, wherein an adhesion of the cured adhesive layer is 1 N/25 mm or more, when the adhesive sheet is bounded to a polyethylene terephthalate film at 23° C. and 50% RH, allowed to stand for 24 hours, and subject to a peel test at 23° C. and 50% RH at a peel rate of 300 mm/min and a peel angle of 180° to measure the adhesion of the cured adhesive layer.

10. The adhesive sheet according to claim 2, wherein the base sheet is a film or sheet formed of a resin, a metal foil, or a laminate thereof.

11. The adhesive sheet according to claim 2, wherein a gas barrier layer is formed on the base sheet either directly or through an additional layer.

* * * * *